United States Patent [19]
Burke et al.

[11] Patent Number: 5,835,037
[45] Date of Patent: Nov. 10, 1998

[54] METHOD AND APPARATUS FOR MODELING DISCRETE DATA SEQUENCES BY MULTIPLE VECTOR REPRESENTATION

[75] Inventors: Kevin Burke, Marietta; Steve Addison, Atlanta, both of Ga.

[73] Assignee: Iterated Systems, Inc., Atlanta, Ga.

[21] Appl. No.: 775,587

[22] Filed: Dec. 31, 1996

[51] Int. Cl.$^6$ ........................................................ H03M 7/00
[52] U.S. Cl. ............................................. 341/106; 348/398
[58] Field of Search .................... 341/106, 67; 348/398, 348/422; 375/240

[56] References Cited

U.S. PATENT DOCUMENTS 5,371,544  12/1994  Jacquin et al. ........................... 348/398
5,428,396   6/1995  Yagasaki et al. ........................ 348/416

FOREIGN PATENT DOCUMENTS

0 314 018  10/1998  European Pat. Off. .
WO 96/11468  4/1996  WIPO .

Primary Examiner—Brian K. Young
Attorney, Agent, or Firm—Finnegan, Henderson, Farabow, Garrett & Dunner, L.L.P.

[57] ABSTRACT

A method for encoding and decoding digital signals, particularly audio signals, by using multiple reference vectors from a codebook and adaptively updating the codebook. The reference vectors from the codebook are combined, using a mathematical combination function, to achieve a synthesized vector that most closely matches the digital signal. The encoded signal consists of the mathematical combination function coefficients and the memory addresses of the reference vectors from the codebook used to achieve the synthesized vector. The encoded signal is decoded by separating the coefficients and the addresses and using a reverse combination procedure to reproduce the synthesized vector. Finally, the synthesized vector is stored in the codebook, by overwriting the oldest data, to adaptively update the codebook.

32 Claims, 6 Drawing Sheets

METHOD AND APPARATUS FOR MODELING DISCRETE DATA SEQUENCES BY MULTIPLE VECTOR REPRESENTATION

BACKGROUND OF THE INVENTION

1. Field of the Invention

The present invention relates generally to digital signal modeling, and more particularly, to coding blocks of digital signals with multiple reference vectors for transmission or storage. Specific applications include wireless communication, computer networks, high fidelity audio compression, and other audio-video systems.

2. Description of the Related Art

Information is often expressed in the form of digital data, a stream of on/off quantities known as "bits." However, even simple original information, such as speech signals or graphic images can result in a tremendous volume of data. Transmitting or storing this data can require a very high-capacity transmission channel or storage medium. To reduce these size requirements, it is desirable to use digital signal modeling to "compress" the digital data to provide an output signal having fewer bits than the original data yet which can be "decompressed" to obtain a reproduction of the original data.

Well-known prior art data compression techniques use predictive coding methods to compress the input digital signal. One prior art technique is known as a predictive coding model. This technique produces a compressed output signal based on past digital data. Often the technique employs an iterative process in which the compressed output signal is compared to the original signal to form an error signal. The process is repeated until the error signal is less than a predetermined limit value. When the error signal is less than the predetermined limit value the output signal is considered similar enough to the original signal. To obtain the reproduction of the original signal ("synthesized signal"), the compression process is reversed. The compression process is typically referred to as "encoding" and the decompression process is referred to as "decoding."

Predictive coding techniques provided a process to encode, transmit, and decode a speech signal. However, the process resulted in a synthesized speech signal that was difficult to understand. This difficulty arose because the method produced an output signal which differed from the original signal by some value of error signal, and this error signal was not included in the compressed output signal or recovered in the synthesized signal.

To increase the accuracy of encoding techniques, other techniques evolved in which the compressed output signal captured, to some extent, the error signal not captured by the predictive technique. Using a compressed signal that includes the error signal will enable a decoder to generate a synthesized signal closer to the original signal, although still not an exact replication.

One known method of generating models capable of representing an error signal, as well as the original signal, employs a "codebook". A codebook is a list of digital entries designed to closely match pieces of the incoming digital signal. For example, a digital signal can comprise a series of samples of an analog signal, in which each sample represents the amplitude of the analog signal at a discrete time interval. Each codebook entry in this example would closely match a particular sample value.

The codebook is stored in a memory, with each entry having a unique address. The address of a particular entry in the codebook is known as a "codeword." For example, a memory may contain one hundred twenty eight addresses 1–128. Each address, such as 1, 55, or 103 contains a digital entry. The size of the digital entry would match the size of the samples of the incoming digital signal.

Some prior art codebook methods estimate only the next sample in a series. However, it is possible to use codebook methods to estimate a group, or vector, of future samples. As used herein, a vector is a consecutive series digital data or sample. One known technique, referred to as vector quantization (VQ), operates similarly to the codebook method and uses a series of digital entries to represent a series of digital samples.

The VQ modeling technique provides greater compression than a normal codebook. This advantage of greater compression, however, comes with the disadvantage of increased complexity. Additionally, the vector codebook entries required for the VQ technique must contain representative digital entries of higher quality (i.e., more closely tailored to the input signal) than generally necessary for normal codebook modeling. Typically, this requirement increases the size of the codebook and correspondingly increases the complexity of the modeling. It is therefore desirable to provide improved methods and apparatus for modeling digital signals which minimize disadvantages of the prior art.

SUMMARY OF THE INVENTION

The advantages and purpose of this invention will be set forth in part from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, the present invention provides improved methods for representing digital signals, regenerating represented digital signals, and any combination thereof. Specifically, the present invention comprises a method comprising the steps of creating an initial codebook comprising a plurality of digital data entries stored in unique memory addresses. Next, a digital signal is received. From the digital signal, the method creates a plurality of target vectors. A plurality of source vectors are developed wherein each source vector comprises a plurality of digital data entries. The source vectors are combined to generate a first synthesized vector. Comparing the first synthesized vector to the target vector allows the method to generate a first error signal indicative of how closely the first synthesized vector corresponds to the target vector. The information associated with the first synthesized vector is stored and the method generates a next synthesized vector. The next synthesized vector is compared to the target vector to generate a next error. If the next error is smaller then the first error, then the method stores the next synthesized vector, the information regarding the next synthesized vector, and the next error as the first synthesized vector and first error and generates another next synthesized vector. This process repeats until it exhausts all possible combinations of source vectors. The addresses of the data entries which constitute the first synthesized vector are outputted as an encoded output signal for that target vector. The synthesized vector, a decoded signal, is stored into a memory address of one of the stored digital data entries to form an updated codebook. Finally, the steps are repeated until all the target vectors have been encoded.

DESCRIPTION OF THE PREFERRED EMBODIMENT

Prior art methods of encoding and decoding digital signals using VQ estimation procedures create a vector consisting of several digital data samples and use a single vector codeword from a fixed codebook. The present invention, however, provides a multivector method to estimate a plurality of digital data samples and adaptively updates the codebook. By using multiple vectors, the present invention achieves greater compression than the normal codebook method because the use of several vectors in combination results in lower error. Furthermore, the present invention decreases the number of entries needed in the codebook to accurately represent the original signal. This is because, for example, where the normal codebook or VQ method may have three or more digital entries stored in the codebook for comparison, the present invention may have only two digital entries stored in the codebook. These two digital entries are combined to make the three or more digital entries for comparison. Thus, combining several vectors in the codebook effectively increases its size (number of entries). This larger "effective" codebook has characteristics better matching the estimated digital data. Additionally, the present invention uses the synthesized vector, that is, the outputted reproduced original signal, to update the codebook and thus tailor the memory of the system to each input signal. This reduces the size of the codebook needed because of the high correspondence between the input vector (target vector or series of consecutive digital samples) and source vector (a series of consecutive entries in the codebook). This reduces the computational complexity of the general VQ method without sacrificing the fidelity of the signal. The high correspondence is achieved because many data sequences exhibit high correlations between past and future signals. The codebook, which exhibits a high correlation between actual and synthesized data, therefore, has a high correlation to the actual input. Therefore, fewer representative signals need to be stored in the codebook to accurately model the original signal.

Figure 1A:
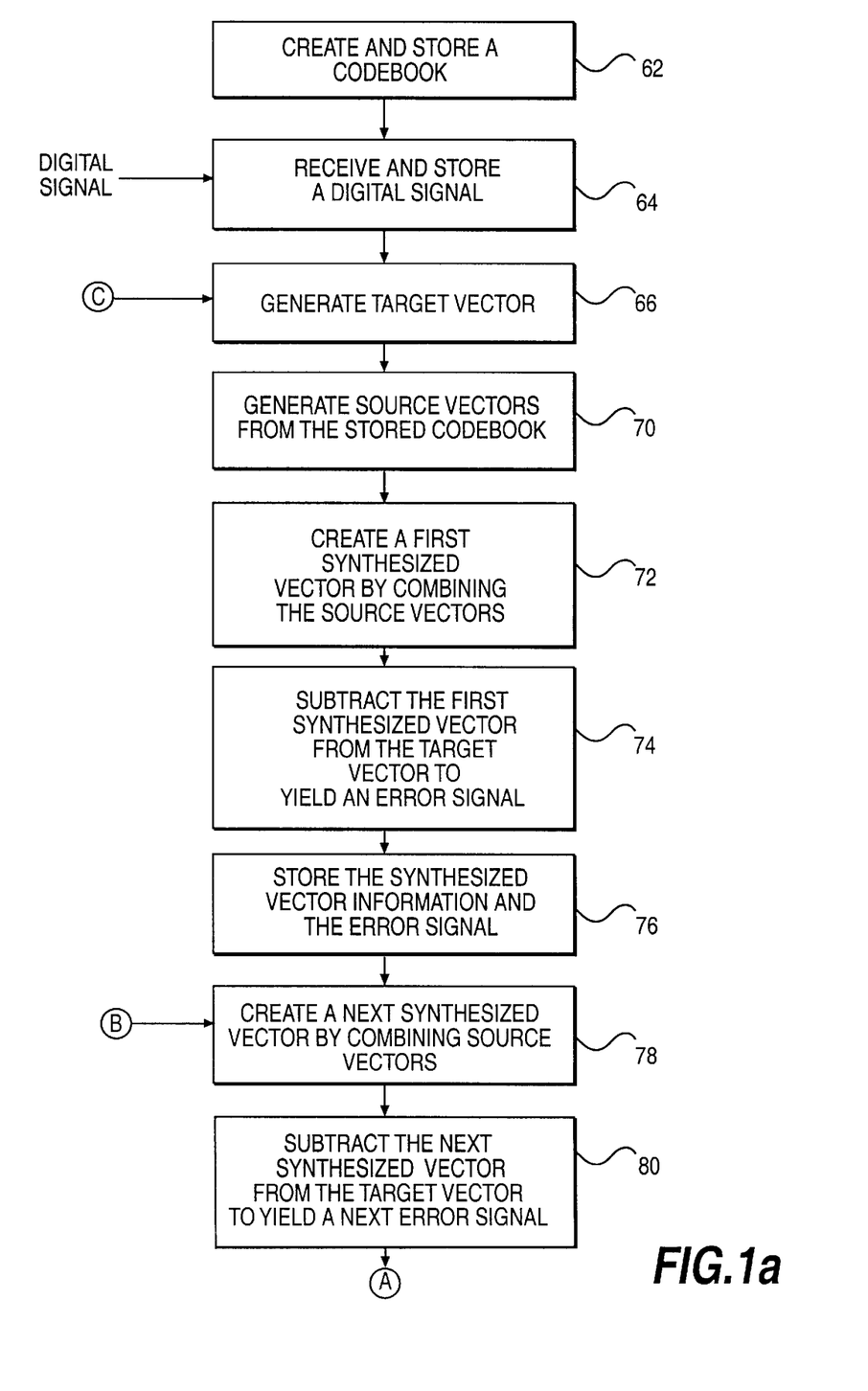
FIGS. 1a and 1b are a flow chart of a preferred method of encoding a digital signal.
Figure 1B:
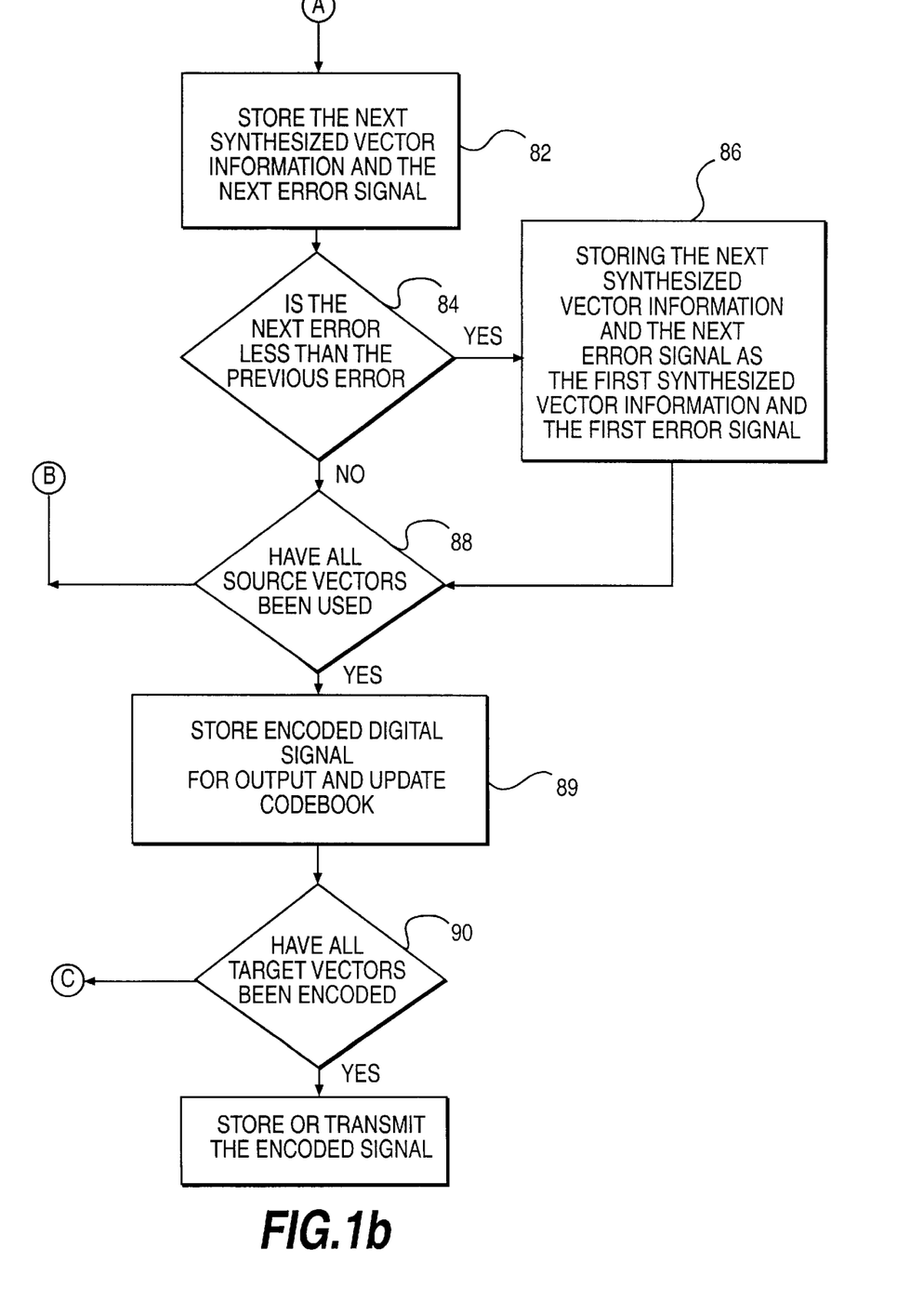
Figure 2:
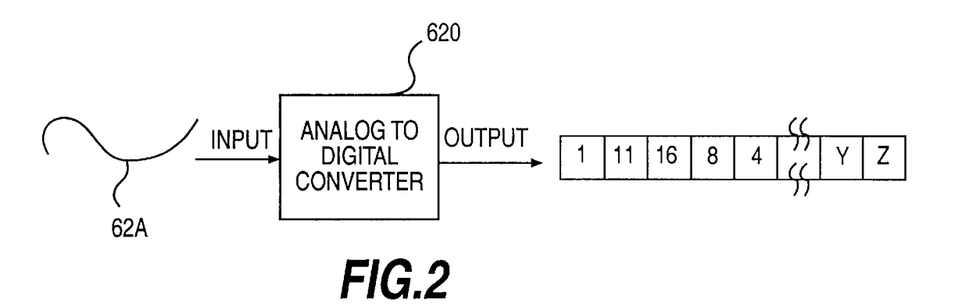
FIG. 2 is a graphical representation of an analog to digital sampling process.

FIG. 1 is a flow chart of a method constituting a preferred embodiment of the present invention, which operates in an audio system to compress audio signals. FIGS. 2–6 provide additional details of the method. To start, the method creates an initial codebook of random or predetermined values, step 62. Then a continuous analog input signal, such as, for example, a speech signal, is received, step 64. This signal may be produced by an audio transducer such as a microphone (not shown) and is subjected to preprocessing in a manner well-known in the art, such as, for example, pre-emphasis filtering. The analog input signal is processed by a conventional analog-to-digital (A/D) converter 620, shown in FIG. 2, to obtain a digital representation of the speech signal 62C consisting of a series of digital numbers 62E, called samples. As shown in FIG. 2, samples 62E may have values of 1, 11, 16, 8, etc. The number of bits contained in any sample 62E depends on the sampling technique used by A/D converter 620, but may be, for example, eight bits.

Figure 3:
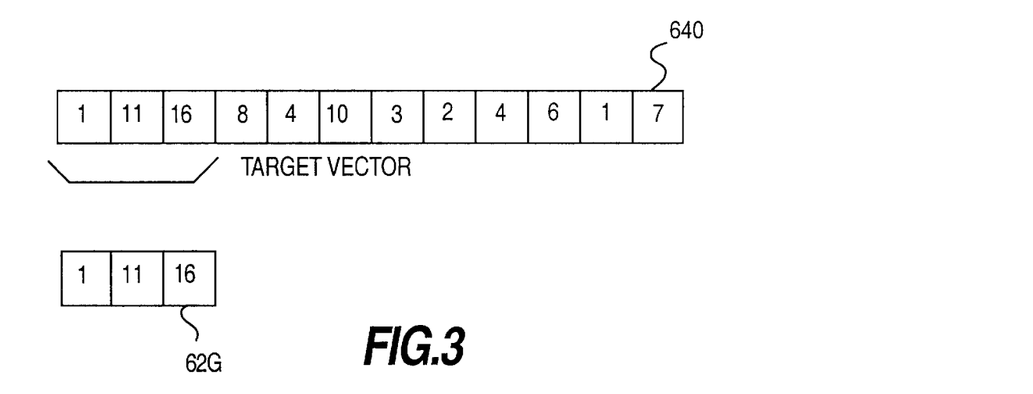
FIG. 3 is a graphical representation of a digital signal and a target vector.

Once digital signal 62C is obtained, at step 64 (FIG. 1), it is stored in a digital signal memory 640. FIG. 3 shows an example of a stored digital signal 62C containing twelve samples 62E. Samples 62E are stored in digital signal memory 640 in consecutive order. In other words, from FIG. 3, samples 62E are received and stored in order, with the sample 62E having a value of "1" being the first stored sample, the sample having the value of "11" being the next stored sample in the digital signal memory, and so on, through the final stored sample which, in the example, has value of "7."

From the digital signal memory, the process at step 66 of FIG. 1 generates a target vector 62G. As seen in FIG. 3, target vector 62G in the preferred embodiment is a group of three consecutive samples 62E stored in memory 640, although target vector 62G can have any number of samples. Each target vector 62G contains unique information, such that target vectors 62G do not overlap. Thus, as shown in FIG. 3, the next target vector would begin with the codebook entry having a value of "8."

Figure 4:
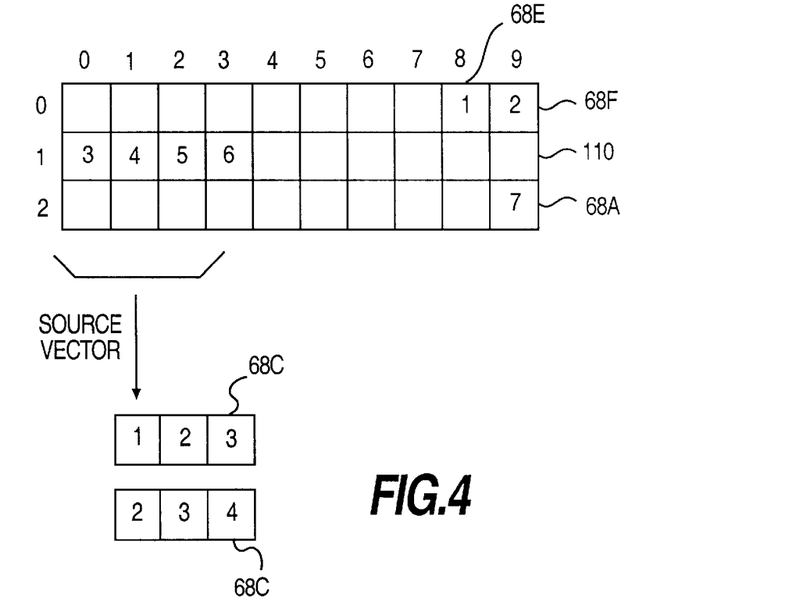
FIG. 4 is a graphical representation of a codebook and source vectors.
Figure 5:
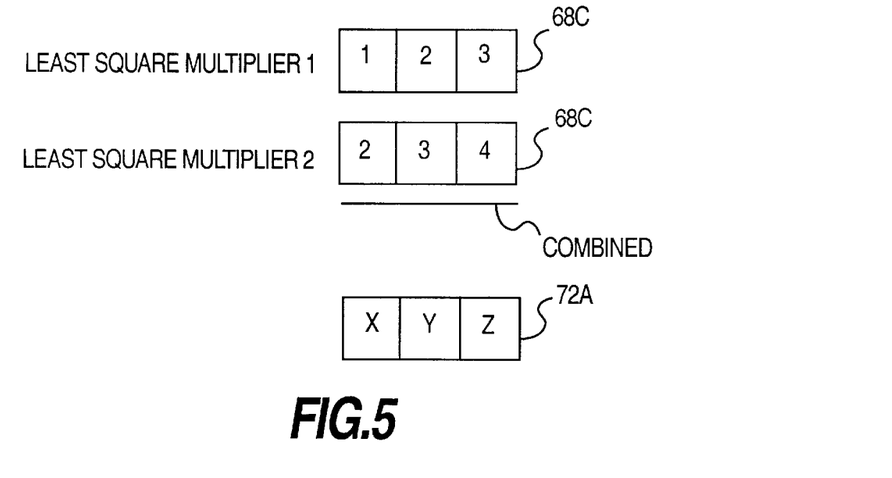
FIG. 5 is a graphical representation of producing a synthesized vector.

As noted above, the method also stores predetermined digital data as a codebook in a codebook memory 110, step 62. The samples stored in the codebook memory are used to generate source vectors, step 68. FIG. 4 represents how source vectors are generated. Initially, codebook memory 110 is a memory device preloaded with predetermined or random digital entries 68A, FIG. 4. Each digital entry 68A is assigned a unique memory address, or codeword at step 70. In this example, source vector memory 110 is shown as a matrix with ten columns 0–9 and three rows 0–2. The address of a digital entry 68A would than be the identification by a column and row of codebook memory 110.

The method generates source vectors 68C from a series of three consecutive digital entries 68A in codebook memory 110. For example, as shown in FIG. 4, two source vectors 68C are shown, one having values of 1,2,3, identified by the memory address (8,0) for digital entry 68E, the other having values of 2,3,4, identified by the memory address (9,0) for digital entry 68F. In the preferred embodiment, source vectors 68C are constrained to be consecutive memory addresses from codebook memory 110; however, source vectors may consist of combinations of non-consecutive digital entries 68A. Note that although the example uses target and source vectors each containing three entries, longer or shorter combinations may be used with the only limitation being that target vectors 62G and source vectors 68C are the same size.

Although not necessary, the preferred method performs an industry standard mean removal when generating both target vectors 62G and source vectors 68C. Thus, the method calculates the mean for any given vector and subtracts this mean from the vector to obtain a normalized vector, be it a normalized target vector or a normalized source vector. Thus, mean removal brings all the vectors to a standard reference value. When performed, the mean removed from target vector 62G is encoded and transmitted with the encoded output signal and added back in the decoding process. The method otherwise performs as described below.

At step 72, the method creates a first synthesized vector as a mathematical combination of a plurality of source vectors. In the preferred embodiment, two source vectors 68C are processed by a mathematical combination function known as a least squares analysis (LSA) to yield a synthesized vector which is the closest possible combination of source vectors 68C to target vector 62G. At step 74, the synthesized vector 72A, shown in FIG. 5, and target vector 62G are subtracted to yield an error signal (not shown). The preferred embodiment uses an LSA; however, other mathematical combination functions may be used.

At step 76, the synthesized vector, least squares multipliers 1 and 2 which were used to create the synthesized vector, memory addresses of the source vectors, and resulting error signal generated by step 74 are stored in a final memory. The method, in the manner described above, creates a next synthesized vector, step 78, and compares it to target vector 62G to produce a next error signal, step 80. At step 82, the next synthesized vector, next least squares multipliers 1 and 2 which were used to create the next synthesized vector, memory addresses of the source vectors, and resulting error signal generated by step 80 are stored in a temporary memory. The method compares the error stored at step 76 with the subsequently generated next error signal stored at step 82, step 84. If the error stored in temporary memory is less then the error stored in final memory (as determined by an industry standard LSA), then the contents of the temporary memory are written over previous values entered in final memory, step 86.

Step 88 determines whether all the source vectors have been use to generate synthesized vectors. If not, then steps 78–86 are repeated for the remaining allowed combinations of source vectors. Otherwise, in step 89, the least square multipliers 1 and 2 and the memory addresses of the source vectors stored in a final memory are stored in an output memory as the encoded digital signal for the first target vector, that is, the first portion of the original input signal. Thus the encoded digital signal for the first target vector consists of a series of digital data representing least square multiplier 1, least square multiplier 2, memory address of the first source vector, and memory address of the second source vector. The value of the mean removal process is also encoded if the mean removal was performed. Additionally, in step 89, the synthesized vector, currently stored in a final memory, is written over certain vectors to update the codebook, as described below.

Steps 66 through 88 are repeated for the next target vector until each target vector is encoded, step 90. An alternative embodiment performs the encoding process, described above, target vector-by-target vector. In other words, as digital signal memory 640, FIG. 3, receives a target vector amount of information, for example, samples 1, 11, 16, that information is encoded by performing steps 68–88 as each target vector of information is received by digital signal memory 640. The next target vector received, for example, samples 8, 4, 10, is encoded when it is received. Thus, the target vectors are encoded on a "real-time" basis instead of loading the complete incoming digital signal into digital signal memory 640 prior to encoding.

Figure 6:
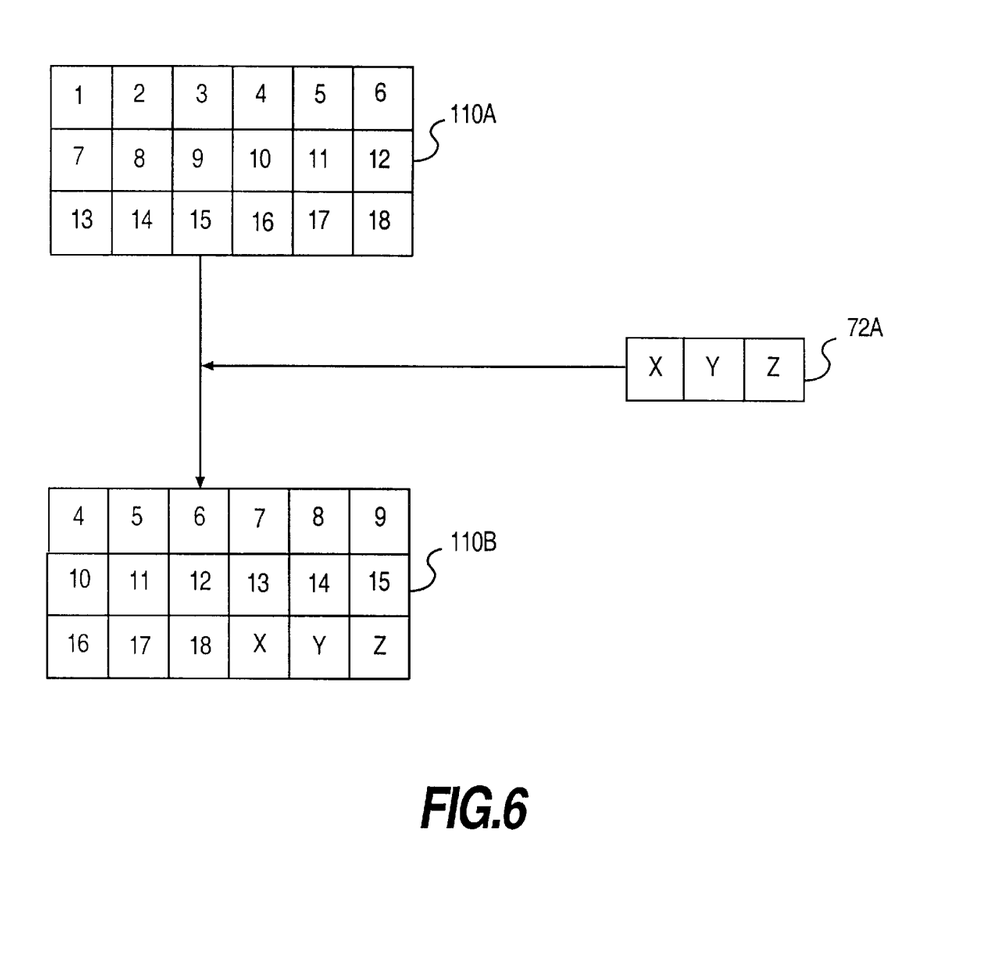
FIG. 6 is a graphical representation of updating the codebook.

FIG. 6 shows how the synthesized vector of the final synthesized vector memory is used to update the digital data of the codebook. The codebook memory 110 is originally initialized to either predetermined or random data. As shown in FIG. 6, digital entries are stored in each of the unique memory addresses 110A. At step 82 the contents of the codebook are updated by receiving the receive synthesized vector from the final memory and by discarding the oldest codebook entries.

Figure 7:
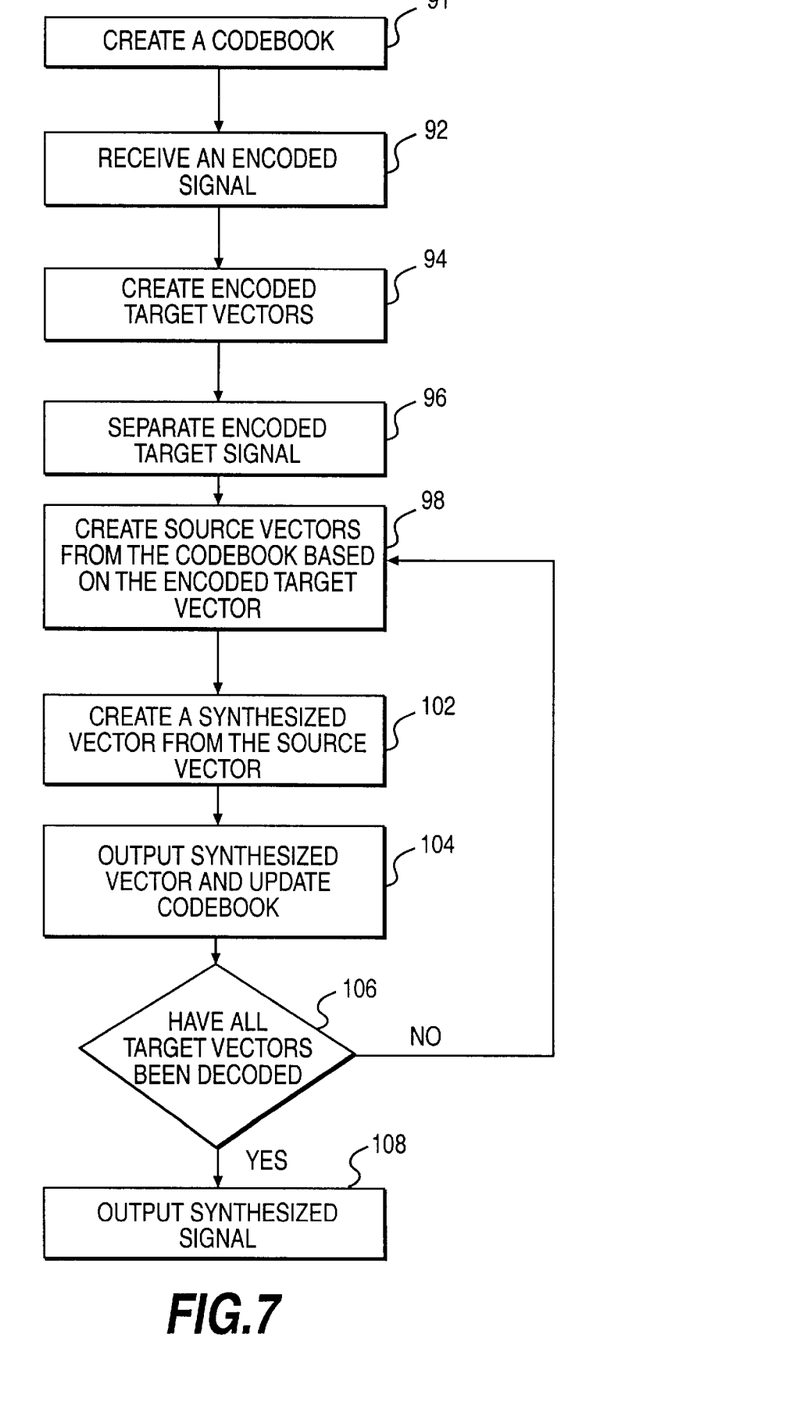
FIG. 7 is a flow chart of a preferred method of decoding an encoded digital signal.

A preferred embodiment of the decoding process is described as follows, FIG. 7. First, at step 91 an initial codebook of predetermined or random data is created, which corresponds to encoder codebook 110, and at step 92, an encoded signal is received. At step 94, an encoded signal is received and separated into encoded target vectors. An alternative embodiment receives encoded target vectors one at a time and performs steps 96–102 for each encoded target vector received. At step 96, the encoded target signal is separated into its least square multipliers 1 and 2 and the memory addresses of the digital data stored in a codebook memory (not shown), which corresponds to codebook memory 110, FIG. 5. If the mean removal was performed that part is also separated from the encoded target signal. From the memory addresses, step 98, the source vectors are retrieved from the codebook memory. If the encoding process uses mean removal, than the retrieval step 98 uses a mean removal when getting the source vectors from the codebook memory. Step 102 uses the least square multipliers to combine the retrieved source vectors to generate a synthesized vector by an LSA. This synthesized vector is loaded into codebook memory in a manner similar to the process shown in FIG. 6 to ensure the decoder codebook memory corresponds to the encoder codebook memory, Step 104. Step 106, if all the target vectors have not been decoded repeat steps 96 through 102, otherwise output the synthesized digital signal, step 108.

An alternative embodiment produces a first synthesized vector (from two source vectors) and calculates, through the least square error method, the error between the first synthesized vector and the target vector. If the error calculated is less than a predetermined threshold, the first synthesized vector is considered a match and the addresses of the data entries which constitute the selected synthesized vector are outputted as a first encoded output signal. Otherwise, the alternative method develops a next synthesized vector until the error is less than a predetermined threshold. As can be seen, the alternative method does not necessarily search the entire codebook using every programmed mapping of every combination of data entries.

Another alternative searches the codebook memory and locates the one or a plurality of best-match source vectors, that is, the source vectors that most closely match the target vector. This one or each of the plurality of best-match source vectors are than combined with all the source vectors in the codebook to find the combination, synthesized vector, that most closely matches the target vector. In other words, in the embodiment described above, the encoding method uses every possible combination of source vectors to find the synthesized vector yielding the closest match, requiring analysis of thousands of combinations. In this alternative embodiment, the method searches the codebook, in this example the 128 source vectors, for the one source vector that most closely matches the target vector and constrains the synthesized combinations such that the best-match source vector is the first source vector. Thus, the possible combinations of synthesized vectors would be one best-match source vector combined with 128 second source vectors to yield 128 synthesized vectors, thus requiring analysis of only 128 combinations.

This first search to find the best source vector could also find the closest plurality of source vectors. In other words, instead of finding the closest match and constraining the first source vector to be the best match, the method could find the closest 2, 3, 4, etc. matches and constrain the first source vector to one of the group of closest matches. The number of combination analized is thus a small multiple (2, 3, 4, etc.) of 128.

As can be seen from the above description, the present invention can combine two, three, or more source vectors to create a synthesized vector. However, the increased representational capacity (similarity of the final estimated output digital signal to the original encoded digital signal) is offset by the increase in the number of combinations which must be processed by the encoder. The preferred embodiment thus employs a standard linear combination of two vectors.

Figure 8:
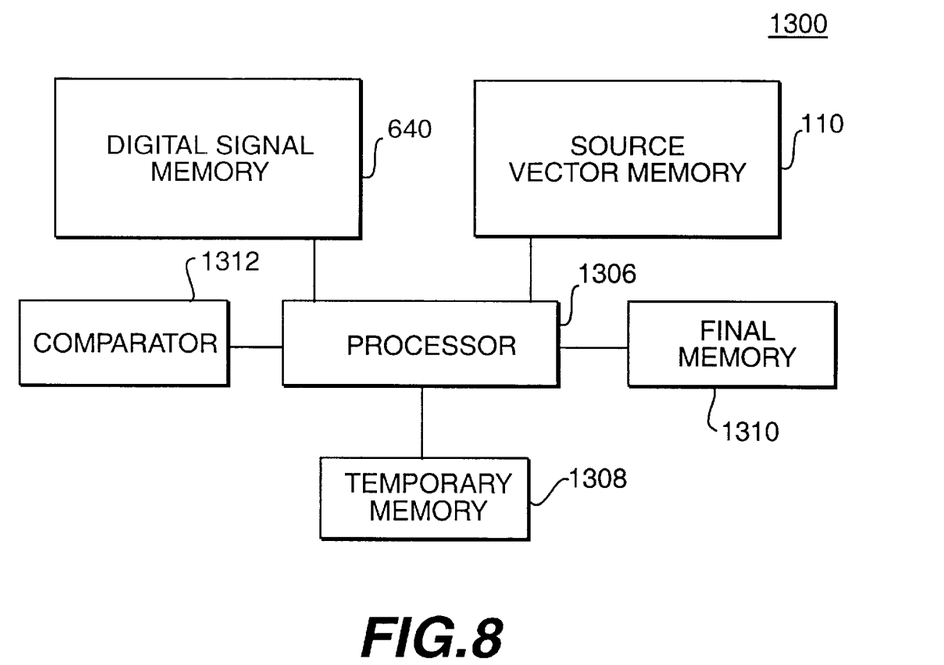
FIG. 8 is a block diagram of a preferred embodiment of an encoder of the present invention.

FIG. 8 is a block diagram of a encoder apparatus 1300 that is capable of carrying out the method described above. Encoder 1300 includes digital signal memory 640 connected a processor 1306, A/D converter 620, and codebook memory 110. Encoder 1300 further includes a comparator 1312, a temporary memory 1308, and a final memory 1310 each connected to processor 1306.

Figure 9:
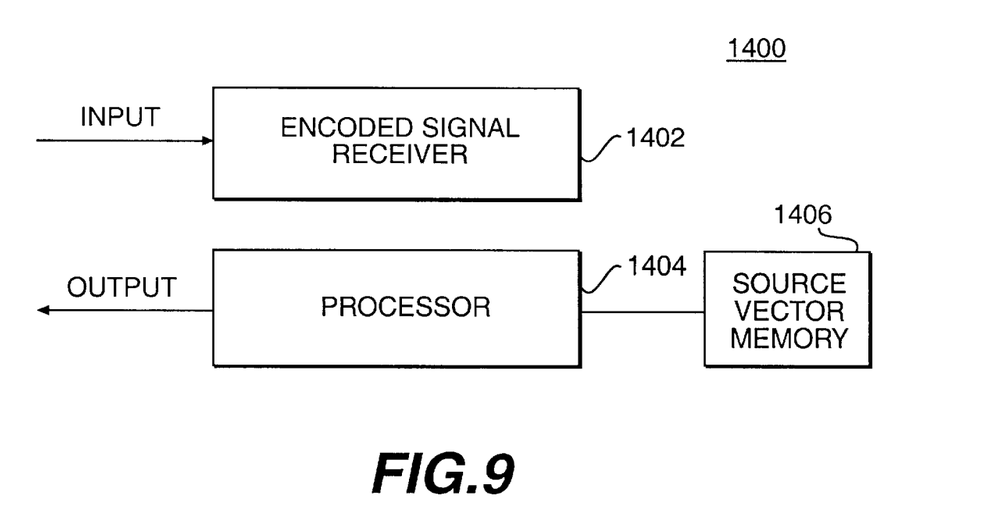
FIG. 9 is a block diagram of a preferred embodiment of a decoder of the present invention.

A block diagram of a decoder apparatus 1400 is shown in FIG. 9. An encoded signal receiver 1402 is connected a processor 1404. A codebook memory 1406, which corresponds to codebook memory 110, FIG. 8, is also connected to processor 1404, to synthesized vector 72A created during the encoding process, which outputs the reproduced original target signal.

The apparatus and method of the preferred encoder and decoder embodiments are implemented on a personal computer using an Intel 486-66 processor operating Windows 3.1. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A method of encoding a digital signal, comprising the steps of:

(a) creating a codebook comprising a plurality of digital data entries each stored in a unique memory address;

(b) receiving a digital signal;

(c) creating a plurality of target vectors from a plurality of non-overlapping portions of the received digital signal;

(d) creating a plurality of source vectors each containing a plurality of the digital data entries;

(e) creating a first synthesized vector from the plurality of source vectors;

(f) comparing a first target vector with the first synthesized vector to create a first error signal;

(g) temporarily storing the first synthesized vector and the first error signal;

(h) creating a next synthesized vector from a plurality of source vectors;

(i) comparing the first target vector with the next synthesized vector to create a next error signal;

(j) determining if the next error signal is less than the first error signal, and if the next error signal is less than the first error signal, temporarily storing the next synthesized vector and the next error signal as the first synthesized vector and the first error signal;

(k) repeating steps (h)–(j) until all source vectors have been developed; and (l) outputting the unique memory addresses of the data entries which constitute the first synthesized vector as an encoded output signal.

2. A method as recited in claim 1 comprising repeating steps (d)–(l) replacing the first target vector with a next target vector until all target vectors have been encoded.

3. A method as recited in claim 1 comprising the step of storing the first synthesized vector into a memory address of one of the stored digital data entries to form an updated codebook.

4. A method as recited in claim 1 wherein the steps of creating a plurality of target vectors comprises the steps of:

calculating the mean of the target vectors;

removing the calculated mean from the target vectors; and outputting the calculated mean form the target vectors as part of the encoded output signal.

5. A method as recited in claim 1 wherein the steps of creating a plurality of source vectors comprises the steps of:

calculating the mean of the source vectors; and removing the calculated mean from source vectors.

6. A method as recited in claim 1 wherein the steps of creating a plurality of target vectors and creating a plurality of source vectors comprises the steps of:

calculating the mean of the target vectors and the source vectors;

removing the calculated mean from the target vectors and source vectors; and outputting the calculated mean form the target vectors as part of the encoded output signal.

7. A method as recited in claim 1 wherein the step of creating the codebook comprises creating the codebook of digital data entries with the means removed.

8. A method as recited in claim 3 wherein the step of creating the codebook comprises creating the codebook of digital data entries with the means removed and the step of storing the first synthesized vector comprises removing the mean prior to storing the first synthesized vector.

9. A method as recited in claim 4 wherein the step of creating the codebook comprises creating the codebook of digital data entries with the means removed.

10. A method as recited in claim 4 wherein the step of creating the codebook comprises creating the codebook of digital data entries with the means removed and comprises the step of storing the first synthesized vector after removing the mean prior to storing the first synthesized vector.

11. A method of encoding a digital signal, comprising the steps of:

(a) creating a codebook comprising a plurality of digital data entries each stored in a unique memory address;

(b) receiving a digital signal;

(c) creating a plurality of target vectors from a plurality of non-overlapping portions of the received digital signal;

(d) creating a plurality of source vectors each containing a plurality of the digital data entries;

(e) creating a first synthesized vector from the plurality of source vectors;

(f) comparing a first target vector with the first synthesized vector to create a first error signal;

(g) temporarily storing the first synthesized vector and the first error signal;

(h) creating a next synthesized vector from a plurality of source vectors;

(i) comparing the first target vector with the next synthesized vector to create a next error signal;

(j) determining if the next error signal is less than the first error signal, and if the next error signal is less than the first error signal, temporarily storing the next synthesized vector and the next error signal as the first synthesized vector and the first error signal;

(k) repeating steps (h)–(j) until all source vectors have been developed;

(l) outputting the unique memory addresses of the data entries which constitute the first synthesized vector as an encoded output signal; and (m) storing the first synthesized vector into a memory address of one of the stored digital data entries to form an updated codebook.

12. A method as recited in claim 11 wherein the steps of creating a plurality of target vectors comprises the steps of:
calculating the mean of the target vectors;
removing the calculated mean from the target vectors; and
outputting the calculated mean form the target vectors as part of the encoded output signal.

13. A method as recited in claim 11 wherein the steps of creating a plurality of source vectors comprises the steps of:
calculating the mean of the source vectors; and
removing the calculated mean from the source vectors.

14. A method as recited in claim 11 wherein the steps of creating a plurality of target vectors and creating a plurality of source vectors comprises the steps of:
calculating the mean of the target vectors and the source vectors;
removing the calculated mean from the target vectors and source vectors; and
outputting the calculated mean form the target vectors as part of the encoded output signal.

15. A method as recited in claim 11 comprising the step of repeating steps (d)–(m) replacing the first target vector with a next target vector until all target vectors have been encoded.

16. A method of encoding as recited in claim 1 wherein the step of creating a plurality of source vectors comprises creating a plurality of source vectors each containing a plurality of consecutive digital data entries.

17. A method of encoding as recited in claim 1 wherein the step of creating a plurality of source vectors comprises creating two source vectors.

18. A method of encoding as recited in claim 1 wherein the step of creating a first synthesized vector and the step of creating a next synthesized vector comprises combining the plurality of source vectors using a mathematical combination function.

19. A method of encoding as recited in claim 1 wherein the step of creating a first synthesized vector and the step of creating a next synthesized vector comprises combining the plurality of source vectors using a least squares function.

20. A method of encoding as recited in claim 1 wherein the step of determining if the next error signal is less than the first error signal uses a least squares procedure.

21. A method of encoding a digital signal, comprising the steps of:

(a) creating a codebook comprising a plurality of digital data entries each stored in a unique memory address;

(b) receiving a digital signal comprising a plurality of digital samples;

(c) creating a target vector from the received digital signal when the received digital signal contains a predetermined number of samples;

(d) creating a plurality of source vectors each containing a plurality of the digital data entries;

(e) creating a first synthesized vector from the plurality of source vectors;

(f) comparing the target vector with the first synthesized vector to create a first error signal;

(g) temporarily storing the first synthesized vector and the first error signal;

(h) creating a next synthesized vector from a plurality of source vectors;

(i) comparing the target vector with the next synthesized vector to create a next error signal;

(j) determining if the next error signal is less than the first error signal, and if the next error signal is less than the first error signal, temporarily storing the next synthesized vector and the next error signal as the first synthesized vector and the first error signal;

(k) repeating steps (h)–(j) until all source vectors have been developed;

(l) outputting the unique memory addresses of the data entries which constitute the first synthesized vector as an encoded output signal; and (m) repeating steps (d)–(l) for a next predetermined amount of samples of the received digital signal until all of the received digital signal has been encoded.

22. A method as recited in claim 21 comprising the step of storing the first synthesized vector into a memory address of one of the stored digital data entries to form an updated codebook.

23. A method of encoding a digital signal, comprising the steps of:

(a) creating a codebook comprising a plurality of digital data entries each stored in a unique memory address;

(b) receiving a digital signal;

(c) creating a plurality of target vectors from a plurality of non-overlapping portions of the received digital signal;

(d) creating a plurality of source vectors each containing a plurality of the digital data entries;

(e) creating a synthesized vector from the plurality of source vectors;

(f) comparing a first target vector with the synthesized vector to create an error signal;

(g) determining whether the error signal is less than or equal to a predetermined threshold, and if the error signal is less than or equal to the predetermined threshold outputting the unique memory addresses of the data entries which constitute the synthesized vector as an encoded output signal, and if the error signal is greater than the predetermined threshold repeating steps (e)–(g);

(h) repeating steps (d)–(g) replacing the first target vector with a next target vector until all target vectors have been encoded.

24. A method as recited in claim 13 comprising the step of storing the synthesized vector into a memory address of one of the stored digital data entries to form an updated codebook.

25. A method of encoding a digital signal, comprising the steps of:

(a) creating a codebook comprising a plurality of digital data entries each stored in a unique memory address;

(b) receiving a digital signal;

(c) creating a plurality of target vectors from a plurality of non-overlapping portions of the received digital signal;

(d) creating a plurality of source vectors each containing a plurality of the digital data entries;

(e) comparing the plurality of source vectors with a first target vector to create a plurality of best match source vectors;

(f) creating a first synthesized vector by combining one of the plurality of best match source vectors with the plurality of source vectors;

(g) comparing a first target vector with the first synthesized vector to create a first error signal;

(h) temporarily storing the first synthesized vector and the first error signal;

(i) creating a next synthesized vector by combining another of the plurality of best match source vectors with the plurality of source vectors;

(j) comparing the first target vector with the next synthesized vector to create a next error signal;

(k) determining if the next error signal is less than the first error signal, and if the next error signal is less than the first error signal, temporarily storing the next synthesized vector and the next error signal as the first synthesized vector and the first error signal;

(l) repeating steps (i)–(k) until all the best match source vectors have been used to create synthesized vectors;

(m) outputting the unique memory addresses of the data entries which constitute the first synthesized vector as an encoded output signal;

(n) storing the first synthesized vector into a memory address of one of the stored digital data entries to form an updated codebook; and (o) repeating steps (d)–(n) replacing the first target vector with a next target vector until all target vectors have been encoded.

26. A method of encoding a digital signal, comprising the steps of:

(a) creating a codebook comprising a plurality of digital data entries each stored in a unique memory address;

(b) receiving a digital signal;

(c) creating a plurality of target vectors from a plurality of non-overlapping portions of the received digital signal;

(d) creating a plurality of source vectors each containing a plurality of the digital data entries;

(e) comparing the plurality of source vectors with a first target vector to create a best match source vector;

(f) creating a synthesized vector by combining the best match source vector with the plurality of source vectors using a mathematical combination function;

(g) outputting the unique memory addresses of the data entries which constitute the synthesized vector as an encoded output signal;

(h) storing the synthesized vector into a memory address of one of the stored digital data entries to form an updated codebook; and (i) repeating steps (d)–(h) replacing the first target vector with a next target vector until all target vectors have been encoded.

27. A method as recited in claim 26 where in the step of creating the synthesized vector comprises the step of combining the best match source vector with the plurality of source vectors using a least squares function.

28. A method of decoding a digital signal, comprising the steps of:

(a) creating a codebook comprising a plurality of digital data entries each stored in a unique memory address;

(b) receiving an encoded digital signal;

(c) creating a plurality of encoded target vectors from the received encoded digital signal;

(d) creating a plurality of source vectors each containing a plurality of the digital data entries based upon a first encoded target vector;

(e) creating a synthesized vector from the plurality of source vectors;

(f) outputting the synthesized vector as a first decoded output signal;

(g) storing the synthesized vector into a memory address of one of the stored digital data entries to form an updated codebook; and (h) repeating steps (d)–(g) replacing the first encoded target vector with a next encoded target vector until all encoded target vectors have been decoded.

29. A method as recited in claim 28 comprises the steps of:

creating the plurality of source vectors includes calculating the mean of the source vectors and removing the mean from the source vectors; and creating a synthesized vector includes adding the mean from the received encoded signal.

30. A method of decoding a digital signal, comprising the steps of:

(a) creating a codebook comprising a plurality of digital data entries each stored in a unique memory address;

(b) receiving an encoded digital signal comprising memory addresses of source vectors used to create a synthesized vector;

(d) creating a plurality of source vectors each containing a plurality of the digital data entries based upon the received encoded digital signal;

(e) creating the synthesized vector from the plurality of source vectors;

(f) outputting the synthesized vector as a decoded output signal; and (g) storing the synthesized vector into a memory address of one of the stored digital data entries to form an updated codebook.

31. An apparatus for encoding a digital signal comprising:

a digital signal memory for storing a plurality of digital samples;

a codebook memory for storing a plurality of digital entries;

a temporary memory for storing a synthesized vector, codebook memory addresses of source vectors used to create the synthesized vector, and an error signal;

a final memory for storing a final synthesized vector, final codebook memory addresses of source vectors used to create the final synthesized vector, and a final error signal;

a processor for receiving a digital signal and storing the digital signal in the digital signal memory; for creating a target vector from a plurality of non-overlapping portions of the receive digital signal; for creating a plurality of source vectors each containing a plurality of the digital data entries; for creating synthesized vectors from the plurality of source vectors; for creating an error signal by comparing the target vector to the synthesized vector; for storing in the temporary memory a synthesized vector, codebook memory addresses of the source vectors used to create the synthesized vector, and an error signal; for storing the contents of the temporary memory in the final memory based upon a comparison between the error signal stored in temporary memory and the final error signal stored in final memory; and for storing the final synthesized vector in the codebook memory; and a comparator for comparing the error signal stored in temporary memory and the final error signal stored in final memory.

32. An apparatus for decoding a digital signal comprising:

an input for receiving an encoded signal;

a encoded signal memory for storing the received encoded signal;

a codebook memory for storing a plurality of digital entries; and a processor for separating the encoded signal into a series of consecutive encoded target signals, for separating the encoded target signals into codebook memory addresses of the source vectors to be used to create a synthesized vector, for retrieving the source vectors identified from the codebook memory addresses of the encoded target signal, for creating the synthesized vector, and for storing the final synthesized vector in the codebook memory.

* * * * *

UNITED STATES PATENT AND TRADEMARK OFFICE
CERTIFICATE OF CORRECTION

PATENT NO. : 5,835,037
DATED : November 10, 1998
INVENTOR(S) : Burke, et al.

It is certified that error appears in the above-indentified patent and that said Letters Patent is hereby corrected as shown below:

Claim 4, col. 8, line 15 change "form" to --from--.

Claim 30, col. 12, after line 35 and before line 45, change "(d)" to --(c)--, "(e)" to --(d)--, "(f)" to --(e)--, and change "(g)" to --(f)--.

Signed and Sealed this

Sixteenth Day of March, 1999

Attest:

Q. TODD DICKINSON

*Attesting Officer*           *Acting Commissioner of Patents and Trademarks*